United States Patent
Noble et al.

[11] Patent Number: 5,996,100
[45] Date of Patent: Nov. 30, 1999

[54] SYSTEM AND METHOD FOR THE INJECTION AND CANCELLATION OF A BIAS VOLTAGE IN AN ATTENUATED CIRCUIT

[75] Inventors: Robert H. Noble, Longmont; Robert B. Smith, Loveland, both of Colo.

[73] Assignee: Hewlett-Packard Company, Palo Alto, Calif.

[21] Appl. No.: 08/995,302

[22] Filed: Dec. 22, 1997

[51] Int. Cl.⁶ .................................................... G01R 31/28

[52] U.S. Cl. ............................................. 714/724; 714/721

[58] Field of Search ....................................... 714/721, 719, 714/724, 735, 736, 737, 745; 324/76.11, 158.1; 365/189.07, 189.09; 375/224; 702/64

[56] References Cited

U.S. PATENT DOCUMENTS 5,179,353  1/1993  Miyake .................................. 330/129
5,383,223  1/1995  Inokuchi ................................ 375/60

*Primary Examiner*—Hoa T. Nguyen
*Attorney, Agent, or Firm*—Patrick J. Murphy

[57] ABSTRACT

A system and method for injecting and canceling a bias voltage in an attenuated circuit is presented. The attenuated circuit is disposed within a tri-state logic-level measurement apparatus. The bias voltage is provided to ensure that when the measurement apparatus is floating, it floats at the tri-state voltage. In one embodiment, a summing network is connected to an attenuator, a first voltage generator which provides a bias voltage and a second voltage generator which provides a cancellation voltage. In another embodiment, a FET amplifier is provided in place of the summing network.

9 Claims, 10 Drawing Sheets

SYSTEM AND METHOD FOR THE INJECTION AND CANCELLATION OF A BIAS VOLTAGE IN AN ATTENUATED CIRCUIT

FIELD OF THE INVENTION

The present invention relates generally to test and measurement instruments and more particularly to a system and method for injecting and canceling a bias voltage in an attenuated circuit.

BACKGROUND OF THE INVENTION

A typical measurement device designed to analyze tri-state logic systems which include a ground-referenced attenuator will show a logical "0" when the probe tip of the device is floating (i.e., open). While this situation is not a problem per se, it does indicate a logical state that doesn't really exist. In other words, the device will show "0," instead of "open," or some similar indication that the probe is not attached to anything. Another problem with this device, is that it will cause a floating data bus to be "tri-stated" when the probe is attached to the bus. That is, the bus is pulled down by the device because the attenuator is ground-referenced.

SUMMARY OF THE INVENTION

The present invention provides a system and method for injecting and canceling a bias voltage from an attenuating circuit. The attenuated circuit is disposed within a tri-state logic-level measurement apparatus. A bias voltage is provided to ensure that when the apparatus is floating, it floats at the tri-state voltage. The tri-state voltage is approximately the average of the upper and lower thresholds for the digital logic family of the device under test. The bias voltage is also injected so that the measurement apparatus (i) does not adversely affect the device under test; and (ii) does not measure a particular logic level (either logical high or law) that doesn't exist.

After being injected into the attenuated circuit, the bias voltage must be eliminated in order to avoid using circuitry to accommodate the bias, such circuitry would result in higher costs, lower accuracy and higher power requirements.

In one embodiment, the present invention comprises an attenuator, a summing network connected to the attenuator, and means for generating a bias voltage and a cancellation voltage which are summed at the summing network. In another embodiment, the summing network is replaced with a dc-restored, ac-coupled FET amplifier.

BRIEF DESCRIPTION OF THE DRAWINGS

FIG. 1b shows a timing diagram for the measurement system of FIG. 1a.

FIG. 2b shows another stage of the circuit diagram of FIG. 2a.

FIG. 2c shows yet another stage of the circuit diagram of FIG. 2a.

FIG. 3b shows another stage of the circuit of FIG. 3a.

FIG. 4b shows another stage of the circuit of FIG. 4a.

DETAILED DESCRIPTION OF THE PREFERRED EMBODIMENT

Briefly, the present invention provides a means for eliminating a bias voltage that is injected into an attenuated circuit. In one preferred embodiment, the attenuated circuit is disposed within a tri-state logic-level measurement apparatus. We provide the bias voltage to ensure that when the apparatus is floating, it floats at the tri-state voltage. The tri-state voltage is approximately the average of the upper and lower thresholds for the digital logic family of the device under test. Furthermore, the bias voltage is injected so that the measurement apparatus (i) does not adversely affect the device under test; and (ii) does not measure a particular logic level (either logical high or law) that doesn't exist.

After being injected into the attenuated circuit, the bias voltage must be eliminated in order to avoid using circuitry to accommodate the bias, such circuitry would result in higher costs, lower accuracy and higher power requirements.

Figure 1A:
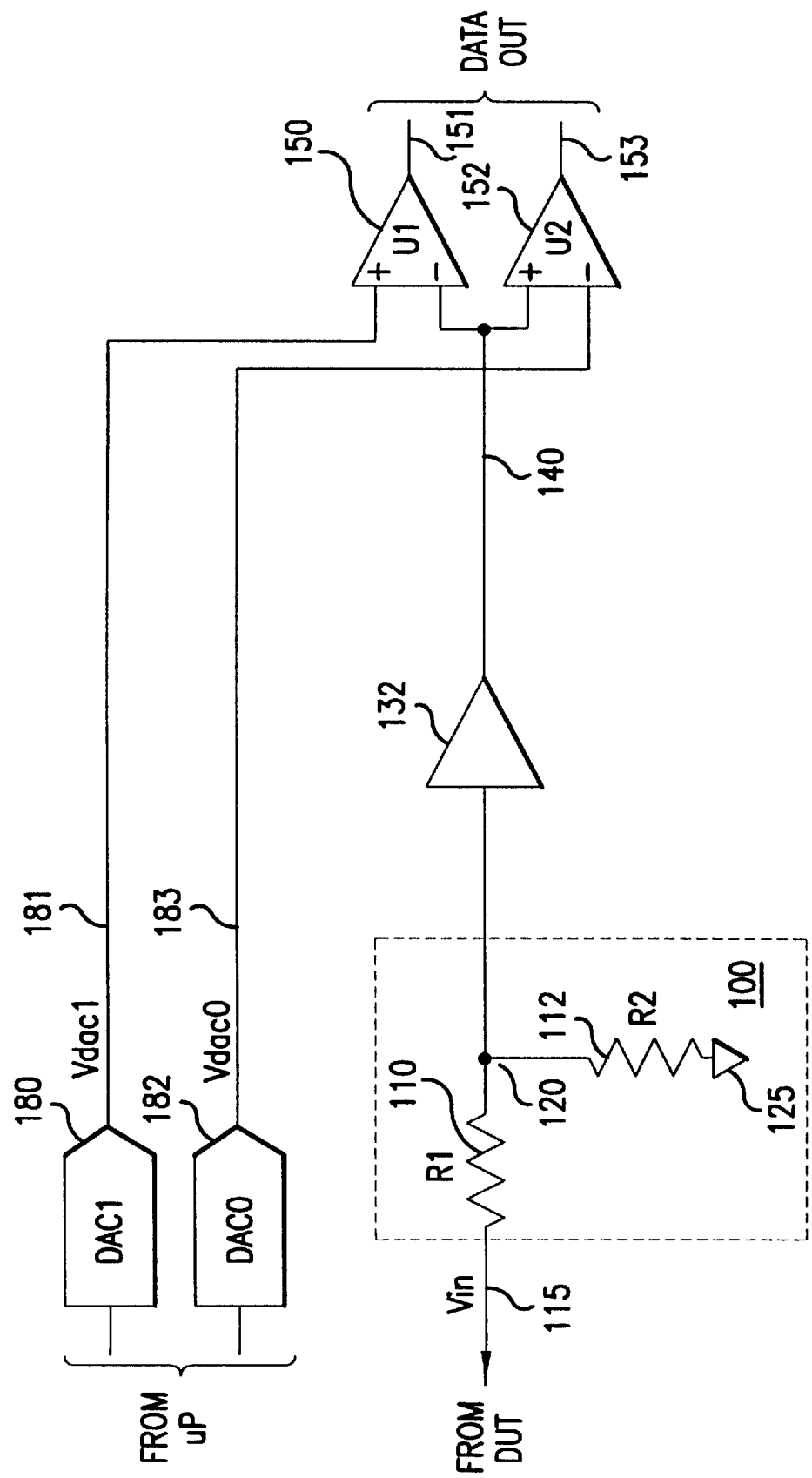
FIG. 1a shows a measurement system for analyzing tri-state logic systems.

FIG. 1a shows a measurement system for analyzing tri-state logic systems. For illustrative purposes, we have illustrated a 5:1 attenuated, ground-referenced measurement circuit. Other attenuation factors and non-ground-referenced designs could be implemented.

The input signal (shown here as Vin) is transmitted from the device under test (DUT), to the measurement system, through R1 110. The first end of R1 110 is connected to the probe tip (not shown) of the measurement system, while the second end of R1 110 is connected to node 120. Disposed from node 120 to ground is R2 112. When the proper resistance values are selected, R1 and R2 comprise a 5:1 attenuator. For example, R1 can be 787 k ohms and R2 can be 196 k ohms.

Node 120 is also connected to the input of analog buffer 132. The output of buffer 132 is connected to node 140 which feeds the inverting input of comparator 150 and the non-inverting input of comparator 152. The other inputs of comparators 150 and 152 are tied to the outputs of two digital-to-analog converters (DACs), items 180 and 182 respectively. The two DACs provide the upper and lower thresholds for the measurement system—Vdac 1 and Vdac0. The outputs of comparators 150 and 152 are connected to nodes 151 and 153 respectively.

Figure 1B:
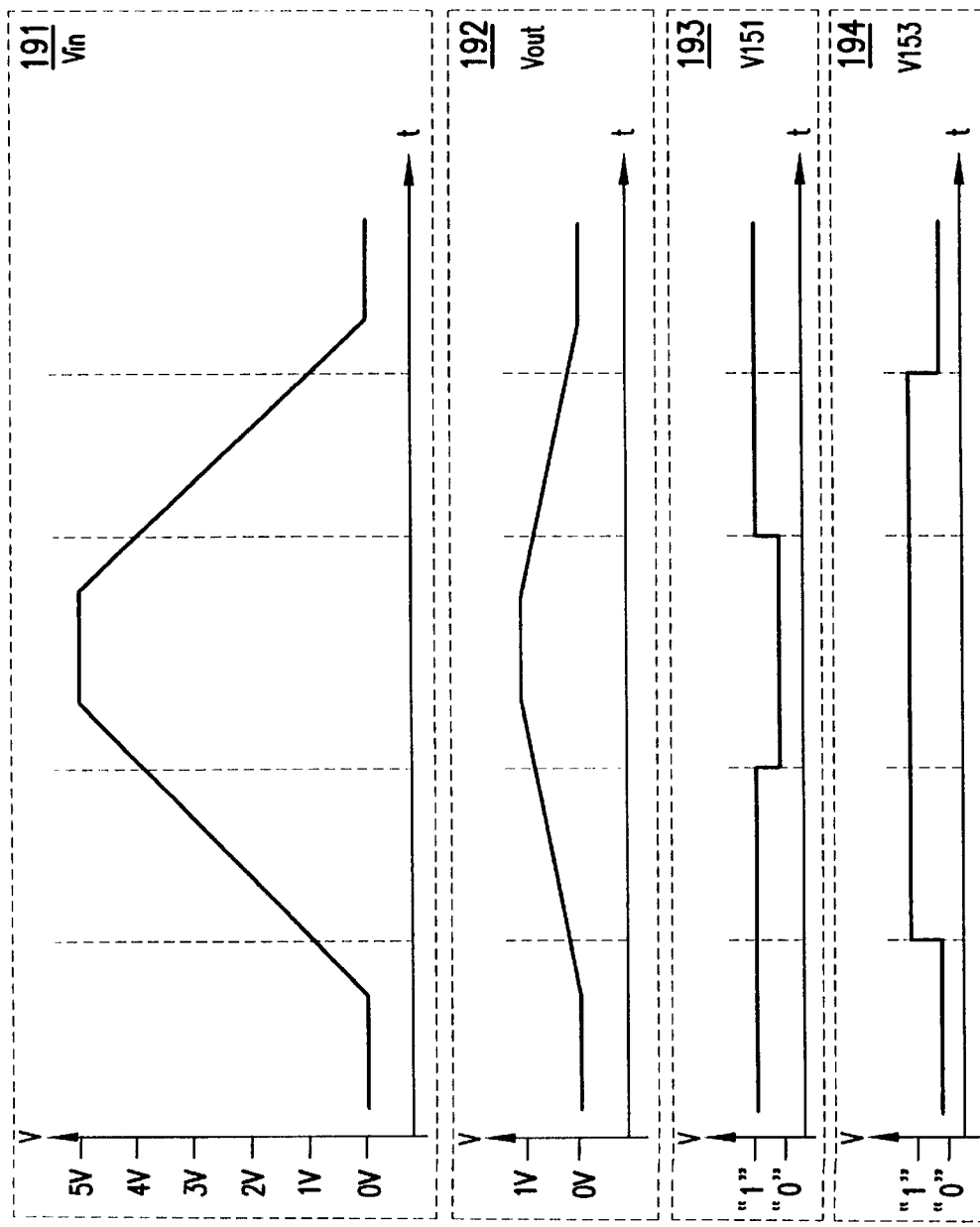

Referring now to FIG. 1b which shows a timing diagram for the measurement of FIG. 1a, the input signal, Vin, is shown transitioning from a low state, through the tri-state, to the high state and back to the low state. Since the circuit in FIG. 1a is a 5:1 attenuator, Vout is ⅕th of Vin and it is shown in FIG. 1b.

Comparator 150 stays high while the input signal is below the high threshold provided by DAC 120. Once the input signal passes the high threshold (i.e., the inverting input of comparator 150 is now greater than the high threshold at the non-inverting input of comparator 150), comparator 150 goes low. Once Vin goes below the high threshold, comparator 150 returns to high. This is illustrated in FIG. 1b as the voltage at node 151, V151.

In a similar manner, comparator 152 stays low while the input signal is below the low threshold provided by DAC 122. Once the input signal passes the low threshold (i.e., the non-inverting input of comparator 152 is now greater than the low threshold at the inverting input of comparator 152), comparator 152 goes low. Once Vin goes below the low threshold, comparator 152 returns to low. This is illustrated in FIG. 1b as the voltage at node 153, V153.

Note that when the probe is not attached to anything (i.e., when the measurement system is open), the float voltage at node 120 is equal to zero, hence the voltage at node 140 is equal to zero and the system will show a logical "zero" at the output. This is illustrative of a first disadvantage of this system; that is, when the system is open, it shows a logical "0" that doesn't exist.

Another disadvantage of this system is that if you hook the probe up to a floating data bus, the probe will pull the bus down, or in other words, the bus will be pulled down to a logical "0." This is due to the fact that R2 112 is grounded.

Figure 1C:
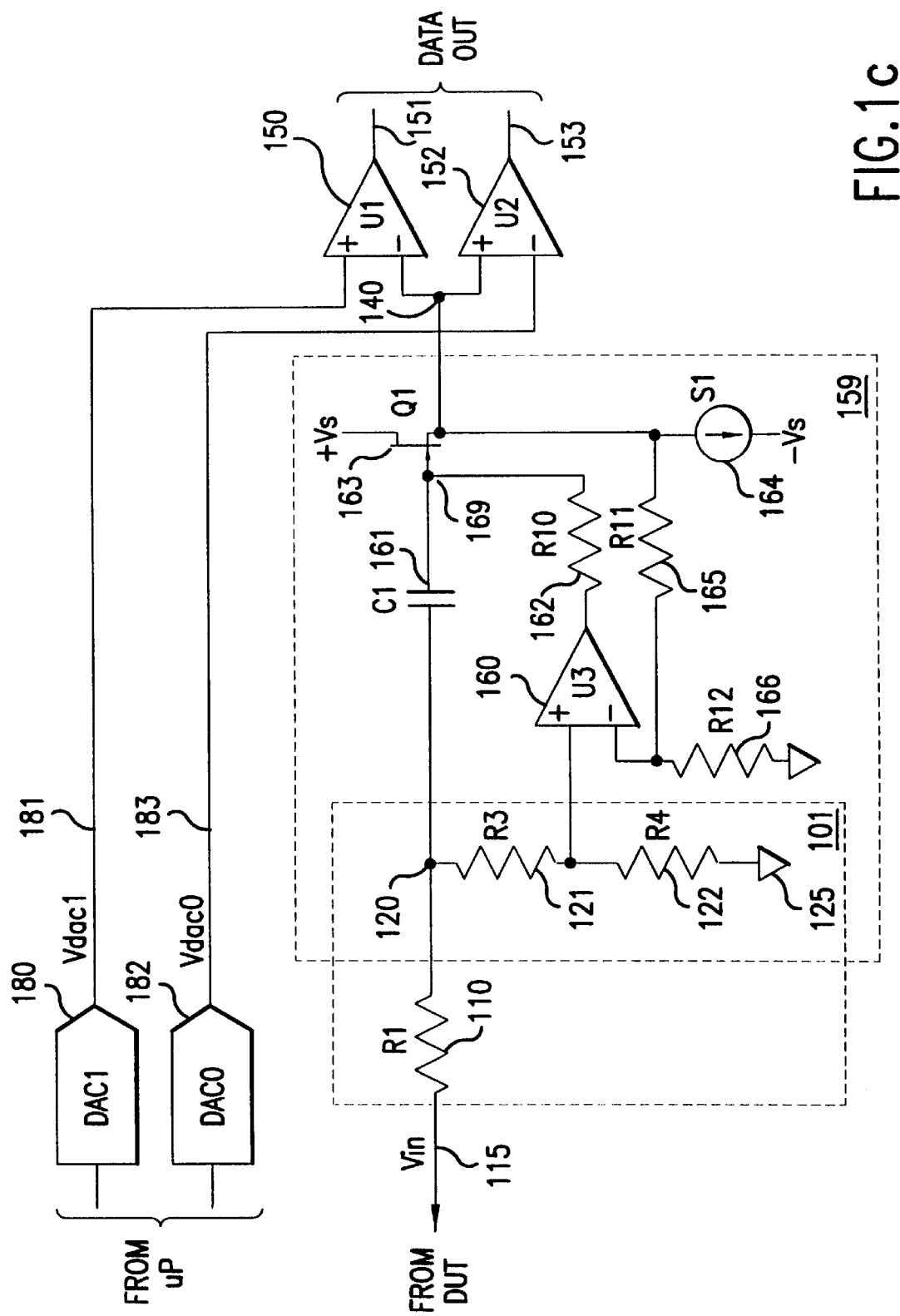
FIG. 1c shows another embodiment of a measurement system for analyzing tri-state logic systems.

FIG. 1c shows another embodiment of a measurement system for analyzing tri-state logic systems. In this embodiment, the analog buffer 132 is replaced by a FET amplifier 159. The attenuator of FIG. 1a (item 100) is replaced by attenuator 101 which comprises R1 110, R3 121 and R4 122. The high frequencies from the input are passed through capacitor 161 to the source-follower FET 163. The dc component of the input signal is restored via the amplifier 159.

Resistor R3 121 isolates the input of amplifier 160 from node 120. R3 121 also acts as an attenuator in conjunction with R4 122 to reduce the input to amplifier 160. The combination of amplifier 160, FET 163, R10 162, R11 165 and R12 166 act as an amplifier to restore the voltage that was attenuated by R3 121 and R4 122. To accomplish this, we ensure that the ratio of R3 121 to R4 122 is about the same ration of R11 165 to R12 166. Thus, any attenuation that occurs with the combination of R3 121 and R4 122 is restored by the FET amplifier 159, the gain of which is set by the ratio of R11 165 to R12 166.

Figure 2A:
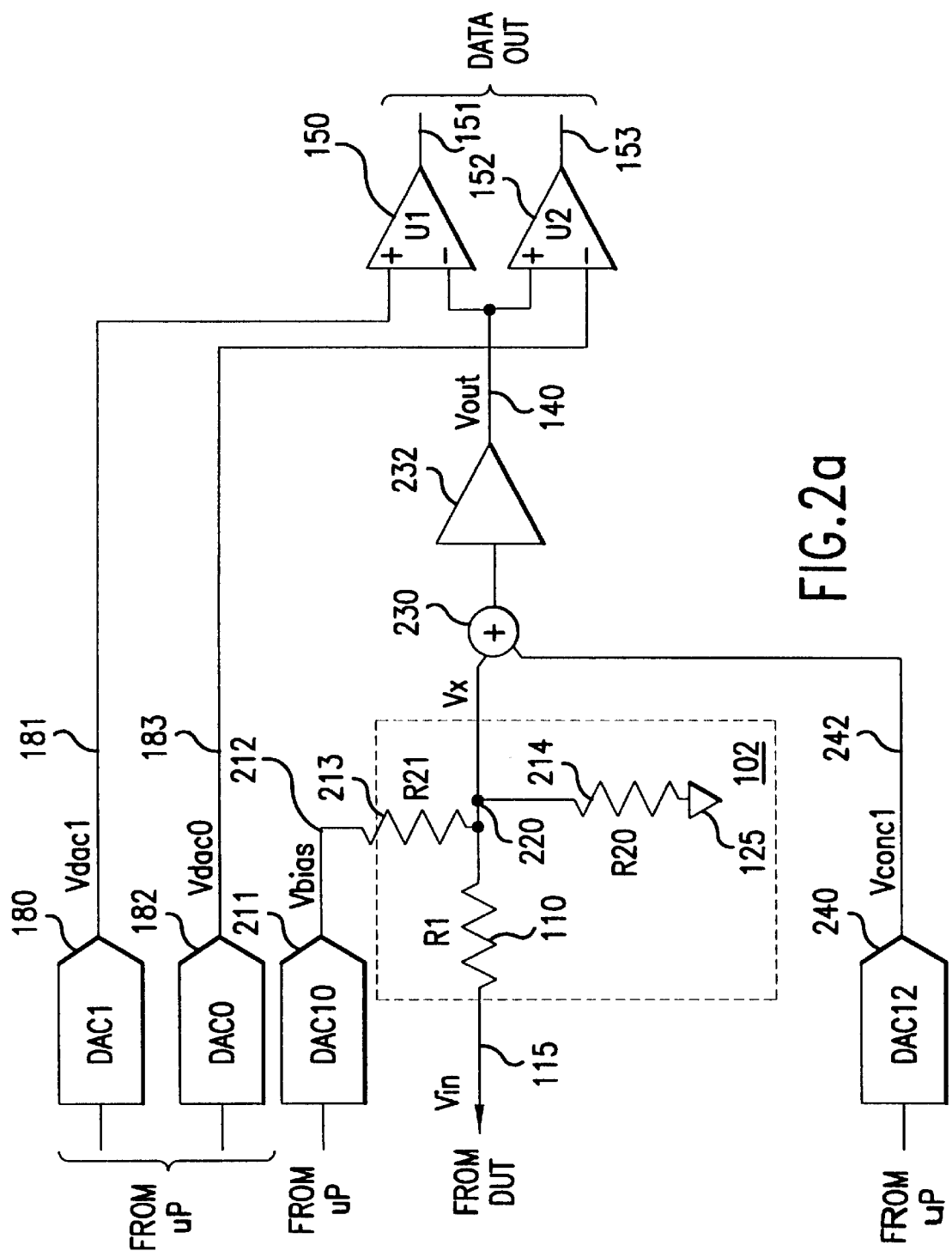
FIG. 2a shows a simplified tri-state injection/cancellation circuit diagram according to the present invention.

FIG. 2a shows a simplified bias injection/cancellation circuit diagram according to the present invention. The first stage of the circuit of FIG. 2a shows how we inject the bias voltage in order to float at the ideal tri-state voltage when the probe is not attached to anything. Keeping the float voltage near the tri-state voltage ensures that the measurement apparatus does not trip into either the low or high state when the probe tip is floating. The second stage of this circuit shows how the bias voltage is eliminated. If the bias voltage was not eliminated, then the buffer 232 and the two comparators 150, 152 of the second stage would have to operate at a higher voltage which would result in higher cost, lower accuracy and higher power.

Referring now to FIG. 2a, the input signal is transmitted to the measurement apparatus through R1 110. The first end of R1 110 is connected to the probe tip, while the second end of R1 110 is connected to node 220. Resistor R21 213 is disposed between node 220 and a voltage source, which nominally is called Vbias 212. In a preferred embodiment, Vbias is provided by a DAC 211 (or any other suitable source) which is itself controlled by a microprocessor.

From node 220 to ground is R20 214. With the proper values selected for R1, R20 and R21, the first stage of the circuit of FIG. 2a can be a divide-by 5 attenuator. Other attenuation factors can be used without departing from the scope of the present invention.

The float voltage is that voltage at node 220 (Vx) when the probe tip is not attached to anything (i.e., open). Vbias is set such that the float voltage at node 220 is approximately equal to the tri-state voltage. In a preferred embodiment, Vx, when floating, is a percentage of Vbias given by the formula:

$$Vx = Vbias * [R20/(R20+R21)].$$

In one preferred embodiment, the tri-state voltage is approximately the average between the upper and lower thresholds for the digital logic family for the device under test. For example, for a 5 volt CMOS logic family, the tri-state voltage is equal to 2.5 volts. For a 3.3 volt CMOS logic family, the tri-state voltage is equal to approximately 1.4 volts.

We now move to the second stage of the circuit of FIG. 2a which introduces how we eliminate the injected bias voltage. Our goal is to ensure that the voltage at node 140, nominally called Vout, is equal to one-fifth of the voltage at node 220, the float voltage. This is due to the fact that we are using a divide-by-5 attenuator 102. We need to attenuate Vx by the same factor as Vin is attenuated by attenuator 102. We accomplish this arithmetically with a summing network 230.

The first input of the summing network 230 is connected to node 220. The second input is connected to a voltage source, nominally called Vcanc1, which in one embodiment can be a DAC 240. At this point, we could totally eliminate the bias voltage for the situation when the input is floating, but there is a better way. In a preferred embodiment (for our ⅕th attenuator), the cancellation voltage is equal to:

$$Vcanc1 = [-\tfrac{4}{5} * Vx]$$

which will ensure that Vout is equal to ⅕th of Vx at node 140. In so doing, Vout is the ⅕th analog equivalent of Vin. The general case is this—in order to end up with the attenuated analog equivalent of Vin at node 140, we add in at the summing network 230:

$$Vcanc1 = -[1 - \text{gain of the attenuator}].$$

The output of summing network 230 is connected to the input of buffer 232. The output of buffer 232 is connected to node 140 which feeds the inverting input of comparator 150 and the non-inverting input of comparator 152. The other inputs of the comparators are tied to the outputs of the DACs (items 180 and 182), which generate the reference voltages, Vdac1 and Vdac0, or the high and low thresholds.

Figure 2B:
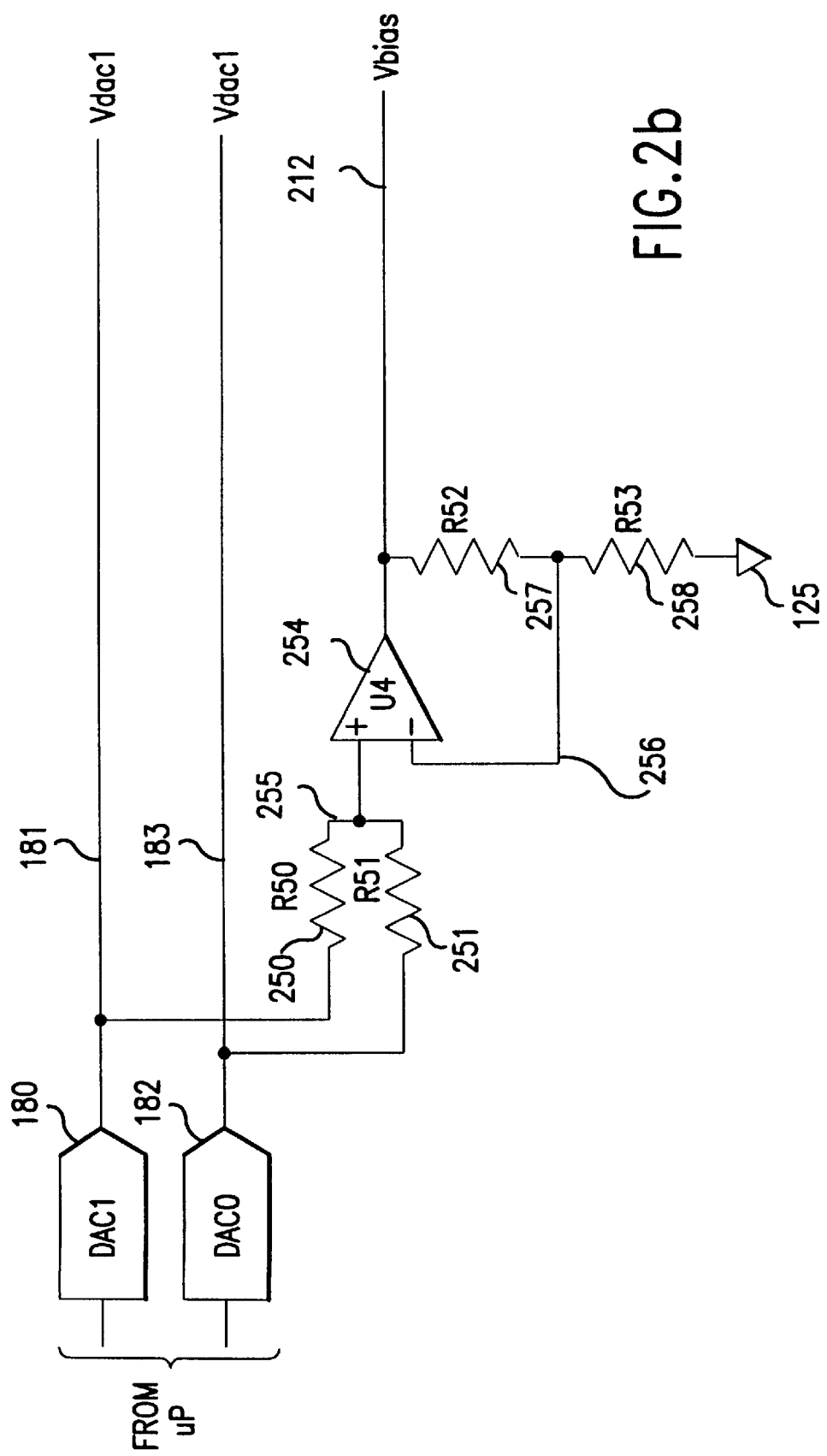

Referring now to FIG. 2b wherein is illustrated another method for generated Vbias. For the condition where the input is floating, we know that Vout is an analog fraction of Vin. Also, Vout is halfway between Vdac1 and Vdac0. Thus, the average of Vdac1 and Vdac0 will always be a fraction of the required Vbias. We therefore conclude that we can use the average of Vdac1 and Vdac0, amplify it with a positive gain amplifier, and call it Vbias. This will obviate the need for DAC 211.

DACs 180 and 182 in FIG. 2b are the same DACs shown in FIGS. 1a and 2a. The output from the DAC 180 is connected to the first end of resistor R 50 250 and is also presented to the non-inverting input of comparator 150 (see FIG. 1a). The output of DAC 182 is connected to the first end of resistor R51 251 and is also presented to the inverting input of comparator 152 (see FIG. 1a). The second ends of R50 250 and R51 251 are connected at node 255. In the preferred embodiment, R50 250 equals R51 251 so that the voltage at node 255 is the average of Vdac1 and Vdac0. Thus, Vbias is a linear function of the voltage at node 255 based upon the values of R52 257 and R53 258 given by the formula:

$$Vbias = V255 * [(R53+R52)/R53].$$

Figure 2C:
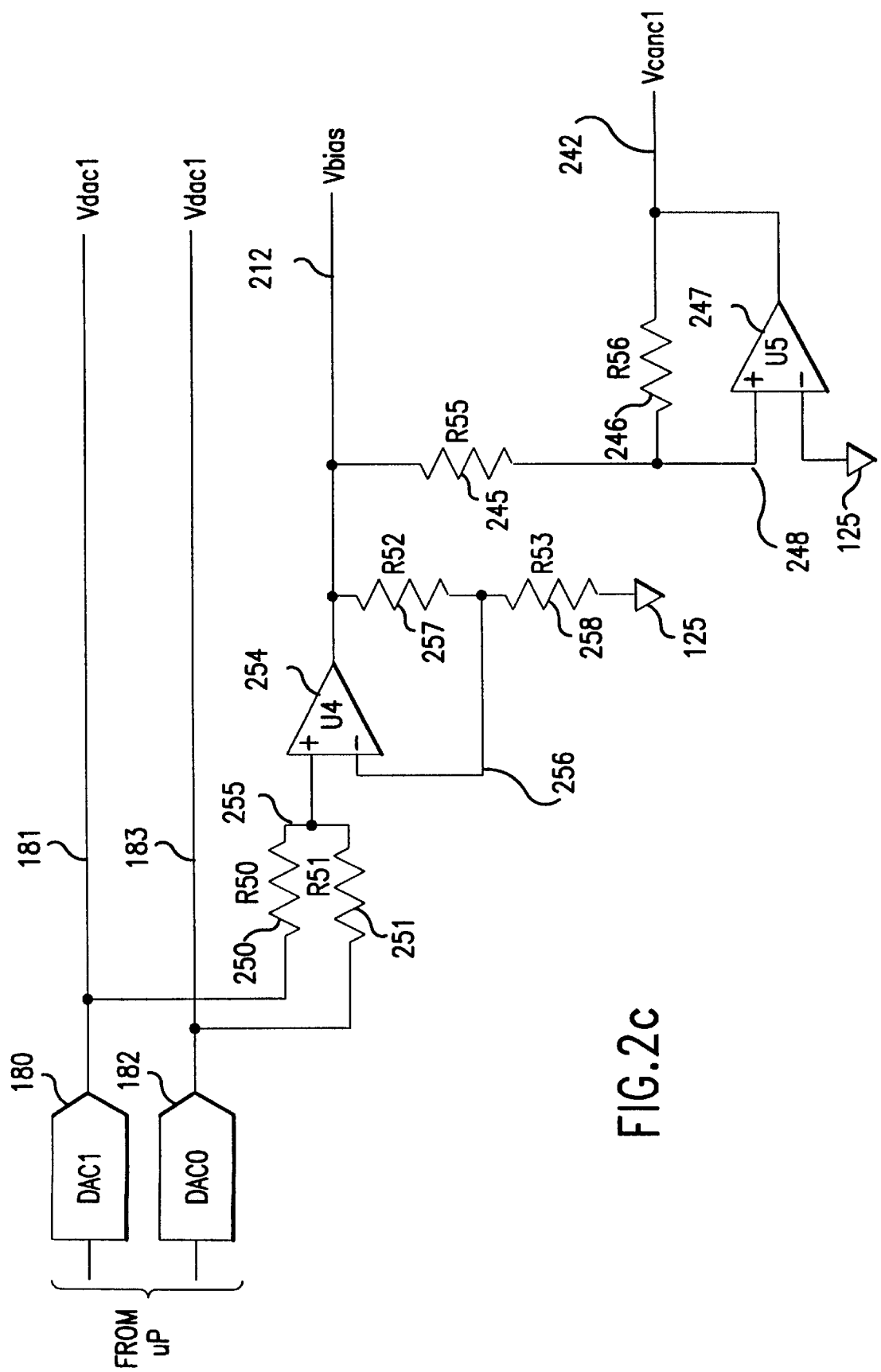

FIG. 2c illustrates another method for generating Vcanc1. We know that Vbias is a linear function of the float voltage. Also, Vcanc1 is also a linear function of the float voltage and, hence, Vbias 212. Thus, we can use the average of Vdac1 and Vdac0, amplify it with a negative gain amplifier and call it Vcanc1.

The first stage of the circuit in FIG. 2c is the same as the circuit in FIG. 2b. At node 242, the output from amplifier 254 is presented as Vbias. This voltage is used to inject a current through R55 245 to the inverting input of amplifier 247. Amplifier 247, along with R55 245 and R56 246, make an inverting amplifier, and under normal operations, the inverting input will assume the same voltage as the non-inverting input which is ground. Thus, node 248 is a virtual ground. Since node 248 is at approximately ground, the output at node 242 (i.e., Vcanc1) is determined by the formula:

Vcanc1=−R56/R55*Vbias.

Now, instead of simply providing a summing network and a buffer as in FIG. 2a, we provide a dc-restored, ac-coupled FET amplifier which gives us high impedance performance, good dc accuracy and wide bandwidth, all important factors given that we are designing this circuit for a measurement apparatus.

Figure 3A:
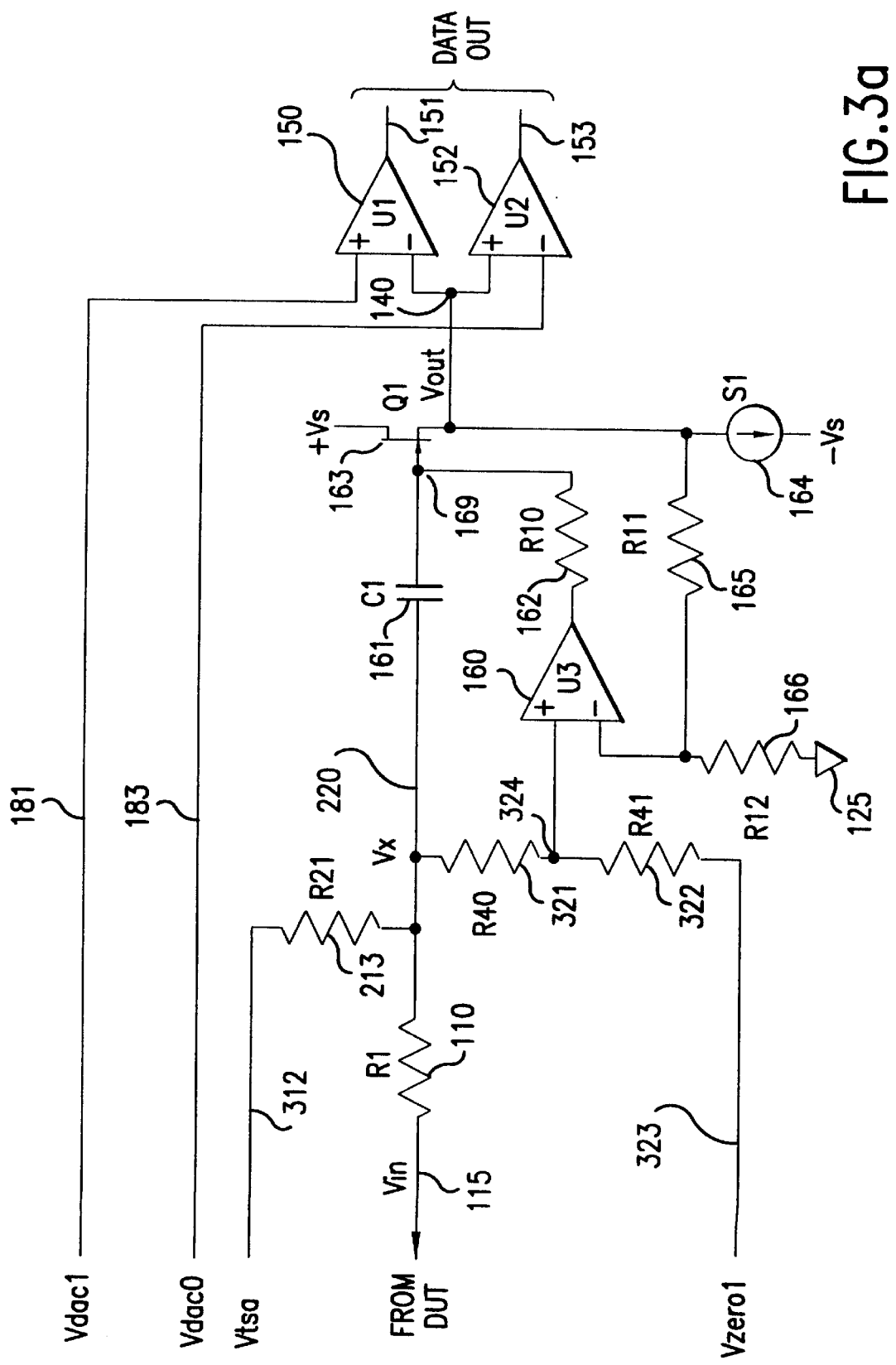
FIG. 3a shows a first embodiment of the present invention for injecting and canceling a bias voltage in an attenuated circuit.
Figure 3B:
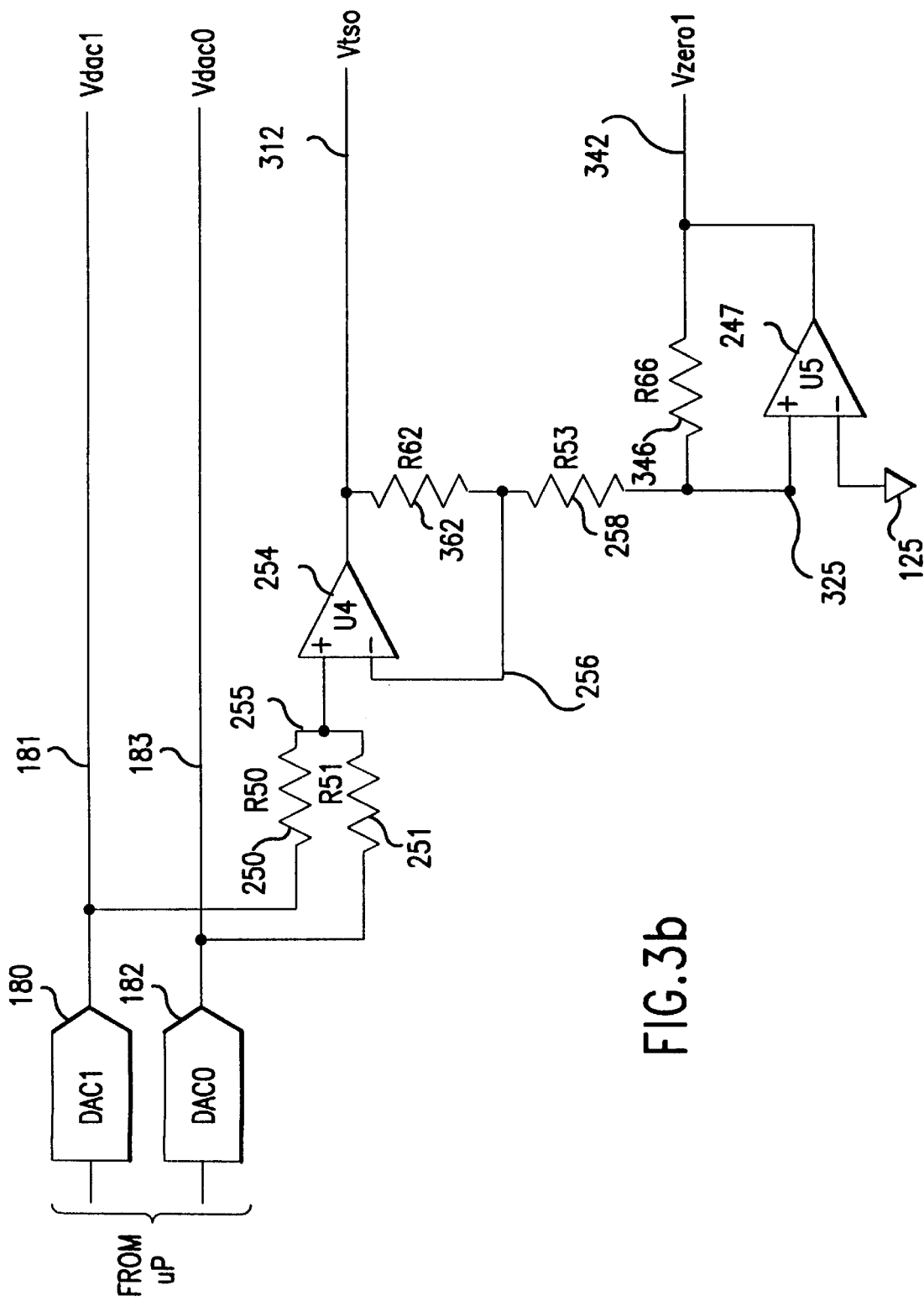

Referring now to FIGS. 3a and 3b wherein one embodiment of our system for eliminating the bias voltage is illustrated. Two DACs (items 180 and 182 in FIG. 2a) generate the reference voltages, Vdac1 and Vdac0, which are presented to the two comparators 150 and 152. Using a similar method as discussed above with reference to FIG. 2c, we use the average of Vdac1 and Vdac0 to generate Vtsa (the "adjusted tri-state bias voltage"). Vtsa takes the place of Vbias of FIG. 2c. Vzero1, which takes the place of Vcanc1 of FIG. 2c, is produced as a linear function of Vtsa.

Referring now to FIG. 3a, the attenuator 102 and summing network 230 (from FIG. 2a) are now implemented with resistors R1 110, R21 213, R40 321 and R41 322. Finally, we introduce the dc-restored, ac-coupled FET amplifier to replace the analog buffer 232 (from FIG. 2a) for the reasons discussed above with reference to FIG. 1c.

Recall that our goal is to ensure that Vout is the ⅕th analog equivalent of Vin. Briefly, R1 110 works like it did before, conducting Vin from the DUT. Vx 220 is a linear function of Vtsa, Vin and Vzero1 as conducted in through the resistors. Vtsa, along with R21, and Vzero1 along with R41 and R40, are chosen so that Vx floats at the ideal tri-state voltage when the input is open.

Node 324 acts as the summing point for Vx and the adjusted cancellation voltage, known as Vzero1, such that Vout will be the ⅕th analog of Vin. For example, when the input is floating, Vout equals ⅕th of Vx.

Vtsa is dropped across R21 213 to node 220. The input voltage, Vin, from the device under test, is brought to node 220 across R1 110 to be summed with a percentage of Vtsa. When the device under test is disconnected from the probe tip, i.e., the input is floating, the voltage is equal to approximately the average of the upper and lower thresholds of the logic family under test.

The AC component of the signal on node 220 (i.e., Vx) is passed through capacitor C1 161 to the source-follower FET 163. A weighted average of the DC component of the signal on node 220 is fed across R40 321 through the FET amplifier. The voltage at node 324 is a weighted average of Vx and Vzero1, based on the resistances R40 321 and R41 322.

Amplifier 160, R10 162, FET 163, R11 165 and R12 166 form our dc-restored, ac-coupled FET amplifier with gain set by R11 165 and R12 166. This gain is disposed to match the attenuation of Vin by R40 321 and R41 322 as presented to the non-inverting input of amp 160. The output of amp 160 is connected through R10 162 to the gate of FET 163. Amp 160 senses the voltage at the source of FET 163 (i.e., node 140) as it is attenuated by R11 165 and R12 166, and presented to the inverting input of amp 220.

Figure 4A:
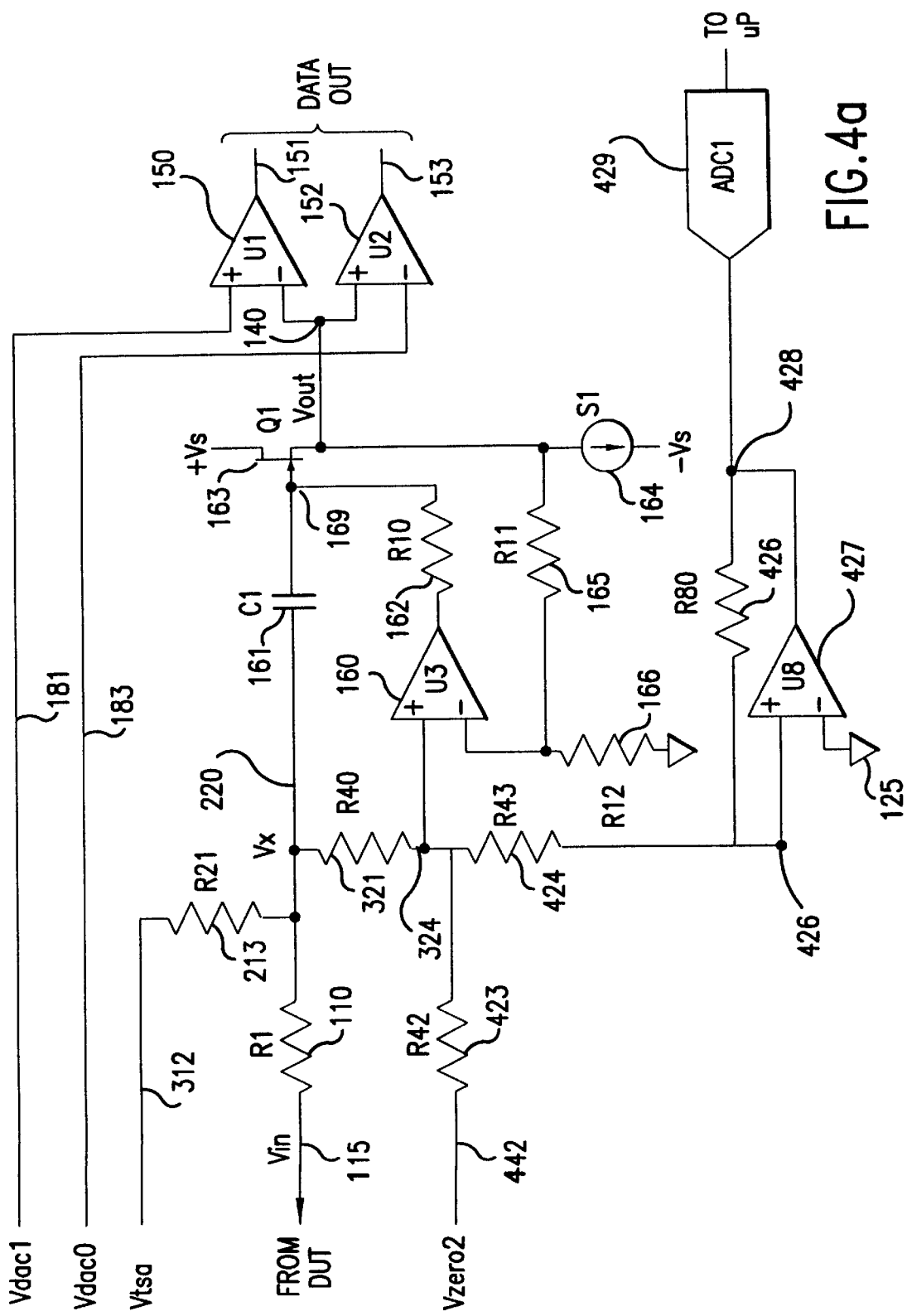
FIG. 4a shows a second embodiment of the present invention for injecting and canceling a bias voltage in an attenuated circuit.

Refer now to FIG. 4a, wherein a feature of the present invention is illustrated. Although the dc voltage of the device under test could be measured at node 140, the noise and hysteresis associated with the comparators 150 and 152 would not yield as accurate a dc voltage reading as we would like.

Briefly described, we double Vzero1, now referred to as Vzero2. We then replace R41 and Vzero1 with the Thevenin equivalent source; this comprises R42 423 connected to Vzero2, R42 423 sharing a common node 324 with R43 424, R43 424 being attached to virtual ground 425. Thus, the voltage at the non-inverting input of amplifier 160 also injects a current through R43 424 into the virtual ground at the inverting input of amplifier 427. This current from R43 424 is converted to a voltage by resistor R80 426 and amplifier 427. This voltage is then measured by analog-to-digital converter (ADC) 429. In this preferred embodiment of the invention, the voltage of the device under test is determined indirectly by virtue of the current that Vin injects through R9 312 rather than by direct means.

Table 1 below shows the preferred values of the various resistors and capacitors of FIGS. 4a and 4c.

TABLE 1

Figure 4B:
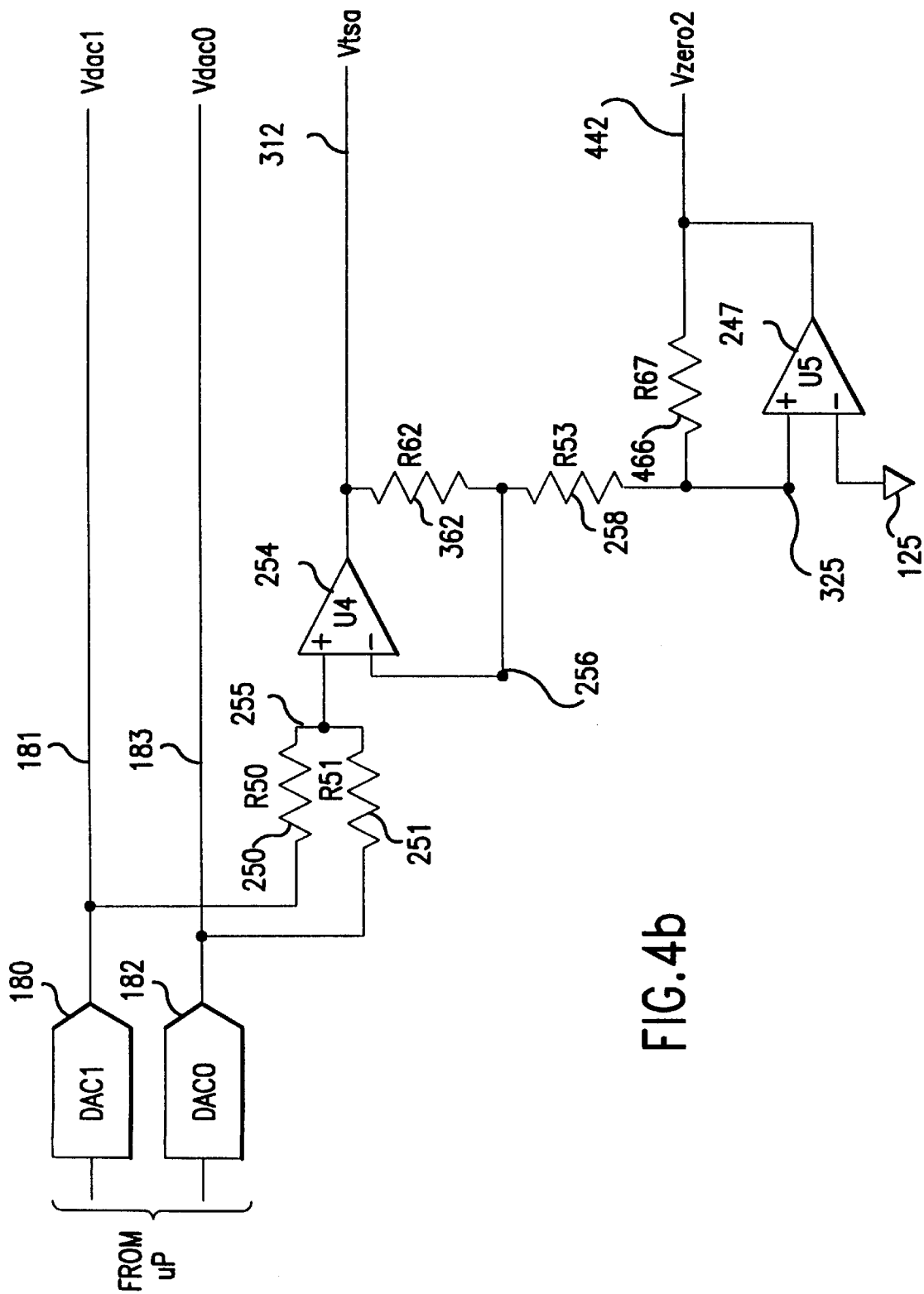

Preferred Values of Resistors and Capacitors for FIGS. 4a–4b

| Item | Value |
| --- | --- |
| R50 | 100k ohms |
| R51 | 100k ohms |
| R62 | 324k ohms |
| R53 | 59k ohms |
| R67 | 117k ohms |
| R21 | 249k ohms |
| R42 | 392k ohms |
| R40 | 787k ohms |
| R43 | 392k ohms |
| R80 | 332.7k ohms |
| R10 | 4.7M ohms |
| R11 | 787k ohms |
| R12 | 200k ohms |
| C1 | 680 picofarads |

While the present invention has been illustrated and described in connection with the preferred embodiments, it is not to be limited to the particular structures shown. It should be understood by those skilled in the art that various changes and modifications may be made within the purview of the appended claims without departing from the true scope and spirit of the invention in its broader aspects.

What is claimed is:

1. An apparatus for eliminating a bias voltage injected into a circuit, the apparatus comprising:

an attenuator, having an attenuator input and an attenuator output, the attenuator input is connected to an input signal;

a summing network having first and second inputs and an output, the first input is connected to the attenuator output, the second input is connected to a voltage source; and an output node, electrically coupled to the output of the summing network;

wherein the voltage at the output node is the analog equivalent of the input signal.

2. The apparatus of claim 1, wherein the attenuator comprises:

a first resistor having first and second ends, the first end is connected to the input signal;

a second resistor having third and fourth ends, the third end is connected to means for generating a voltage, the fourth end is connected to the second end; and a third resistor having fifth and sixth ends, the fifth end is connected to the second end, the sixth end is connected to ground.

3. The apparatus of claim 2 wherein the attenuator attenuates the input signal by a pre-determined attenuation factor.

4. The apparatus of claim 3, wherein the voltage at the output node is equal to the input signal multiplied by the pre-determined attenuation factor.

5. The apparatus of claim 4, wherein the voltage source is a first digital-to-analog converter.

6. The apparatus of claim 5, wherein the means for generating a voltage is a second digital-to-analog converter.

7. An apparatus for eliminating a bias voltage injected into a circuit, the apparatus comprising:

an attenuator, having an input and an output, the input of the attenuator is connected to an input signal;

A FET amplifier having an FET input and FET output, the FET input is connected to the attenuator output; and an output node, electrically coupled to the FET output;

wherein the voltage at the output node is the analog equivalent of the input signal.

8. The apparatus of claim 7, wherein the FET amplifier comprises:

an amplifier, the amplifier having an amplifier input and an amplifier output;

an attenuator, the attenuator having an attenuator input and and attenuator output, the attenuator input connected to a node, the attenuator output connected to the amplifier input;

restore means, the restore means having an input and output, the input of the restore means connected to the amplifier output; and a FET, the FET connected to the output of the restore means.

9. The apparatus of claim 8, wherein the voltage at the node is equal to a weighted average of the input signal, a bias voltage and a cancellation voltage.

* * * * *